(12) United States Patent
Sridhar

(10) Patent No.: US 6,573,791 B2  
(45) Date of Patent: Jun. 3, 2003

(54) MULTIPATH NESTED GM NESTED MILLER COMPENSATION

(75) Inventor: Raghavendra N. Sridhar, Tempe, AR (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/967,418

(22) Filed: Sep. 28, 2001

(65) Prior Publication Data

US 2003/0067351 A1 Apr. 10, 2003

(51) Int. Cl.$^7$ ................................................. H03F 1/36
(52) U.S. Cl. ........................ 330/109; 330/100; 330/151
(58) Field of Search ........................... 330/98, 99, 100, 330/107, 109, 150, 151

(56) References Cited

U.S. PATENT DOCUMENTS

| | | | | |
|---|---|---|---|---|
| 5,155,447 A | * | 10/1992 | Huijsing et al. | 330/107 |
| 5,917,376 A | * | 6/1999 | Ivanov et al. | 330/151 |
| 6,150,884 A | * | 11/2000 | Fattaruso | 330/257 |
| 6,208,206 B1 | * | 3/2001 | Leung et al. | 330/107 |

OTHER PUBLICATIONS de Langen et al., "A 1–GHz Bipolar Class–AB Operational Amplifier with Multipath Nested Miller Compensation for 76–dB Gain", IEEE Journal of Solid–State Circuits, vol. 32, No. 4, pp. 488–498, Apr. 1997.

Eschauzier et al., "A 100–MHz 100–dB Operational Amplifier with Multipath Nested Miller Compensation Structure", IEEE Journal of Solid–State Circuits, vol. 27, No. 12, pp. 1709–1717, Dec. 1992.

Eschauzier et al., "Multistage Compensation Techniques", Frequency Compensation Techniques for Low Power Operational Amplifiers, ch. 5, 1995, Kluwer, Boston, MA, USA.

Eschauzier et al., "Multipath Compensation Techniques" Frequency Compensation Techniques for Low Power Operational Amplifiers, ch. 6, 1995, Kluwer, Boston, MA, USA You et al., "Multistage Amplifier Topologies with Nested $G_m$–C Compensation", IEEE Journal of Solid–State Circuits, vol. 32, No. 12, pp. 2000–2011, Dec. 1997.

\* cited by examiner

Primary Examiner—Robert Pascal  
Assistant Examiner—Khanh Van Nguyen  
(74) Attorney, Agent, or Firm—Peter Zawilski

(57) ABSTRACT

A compensated three stage amplifier having high gain as well as high speed is disclosed. The amplifier comprises a NMC and NGCC compensated cascaded three stage amplifier for receiving an input signal and for providing an amplified output signal in dependence thereupon. An extra feed forward transconductance stage extending from the input port of a first gain stage to the output port of a second gain stage of the amplifier is used in order to cancel one of two non-dominant poles in the transfer function of the amplifier with the additional zero introduced by the extra signal path. This results in a transfer function for a three stage cascaded amplifier having only two poles, which is highly desirable by allowing design of such amplifiers providing stable operation at high gain as well as high speed.

14 Claims, 5 Drawing Sheets

MULTIPATH NESTED GM NESTED MILLER COMPENSATION

FIELD OF THE INVENTION

This invention relates to the field of multistage amplifiers and, more particularly, to a novel compensation topology for multistage amplifiers having high gain as well as high bandwidth.

BACKGROUND OF THE INVENTION

High-gain and high-speed amplifiers are vital in modern analog electronic circuits and are used in a wide range of applications. The increasing tendency towards low-voltage designs, especially as many devices and integrated circuits are made to smaller dimensions, causes significant problems in amplifier design.

A particular problem is that as the power supply voltage is scaled down in the design, the threshold voltage does not necessarily scale down in the same way. For an operational amplifier in such a situation conventional vertical gain enhancement techniques (cascoding) are no longer suitable for low-voltage applications and instead horizontal gain enhancement techniques (cascading) are employed. Typically, modern cascaded amplifiers comprise three amplifier stages. However, with three cascaded amplifiers the stability of the amplifier and its bandwidth are both limited using existing frequency compensation techniques.

To achieve stability at high frequencies in multistage amplifiers, a stabilization topology called Nested Miller Compensation (NMC) was proposed by R. Eschauzier and J. Huijsing, "Frequency Compensation Techniques for Low Power Operational Amplifiers", Boston, Mass., Kluwer, (1995). The main drawback of this technique is that the Miller capacitors in the feedback path introduce zeroes in the Right Hand complex S-Plane (RHP) degrading stability of the amplifier at high frequencies. The position in the S-Plane of one of these zeroes is directly related to the transconductance of the final stage amplifier. As the transconductance of the final stage amplifier changes due to changes in the load also the positions of the zeroes with respect to frequency changes.

To overcome the drawback of the NMC Fan You and S. H. Embabi disclosed in "Multistage Amplifier Topologies with Nested Gm-C Compensation", IEEE J. Solid State Circuits, Vol. 32, pp 2000–2011, (1997) the nested Gm-C Compensation (NGCC) topology to cancel out the zeros introduced by the Miller capacitors. However, it is not possible to use this technique for multistage amplifiers having high gain as well as high bandwidth, because it only cancels the zeros introduced by the Miller capacitors. For example, in case of a three stage amplifier the transfer function has three poles, which provide substantial difficulties in the design of a three stage amplifier having high gain as well as high bandwidth.

To achieve higher bandwidth a feed forward path has been introduced into the existing NMC compensation circuits. The feed forward path introduces a zero in the transfer function, which is positioned such that it cancels out one of the non-dominant poles in the transfer function. This topology is known as Multipath Nested Miller Compensation (MNMC) and is disclosed in:

R. Eschauzier and J. Huijsing, "Frequency Compensation Techniques for Low Power Operational Amplifiers", Boston, Mass., Kluwer, (1995);

R. Eschauzier, L. Kerklaan, and J. Huijsing; "A 100-MHz 100-dB Operational Amplifier with Multipath Nested Miller Compensation Structure", IEEE J. Solid-State Circuits, Vol. SC-27, pp. 1709–1717, (1992); and, K. Langen, R. Eschauzier, and J. Huijsing, "A 1 GHz Class-AB Amplifier with Multipath Nested Miller Compensation for 76 dB gain", IEEE J. Solid State Circuits, Vol. SC-32, pp. 488–498, (1997).

However, this compensation topology also suffers from the same drawbacks as the NMC topology and does not provide reliable operation of multistage amplifiers having high gain as well as high bandwidth.

It is, therefore, an object of the invention to provide a compensation topology allowing stable operation of high gain, high bandwidth multistage amplifiers. In particular, it is an object of the invention to provide a compensated three stage amplifier having high gain as well as high bandwidth.

SUMMARY OF THE INVENTION

In order to overcome the drawbacks of the prior art the compensation technique according to the invention introduces circuit elements to cancel the zeros introduced by the Miller capacitors as well as one of the non-dominant poles in the transfer function of a three stage amplifier. The final transfer function of a such compensated cascaded three stage amplifier has then only two poles. Such a two pole system is much more desirable for designing a stable cascaded amplifier having high gain as well as a wide operating bandwidth, because it substantially facilitates the design of a stable operating three stage amplifier.

According to the invention there is provided a compensated three stage amplifier comprising:

a first, a second and a third cascaded gain stage for amplifying an input signal and providing an output signal in dependence thereupon, each gain stage comprising an input port and an output port, wherein the input signal is received at the input port of the first gain stage and wherein the output signal is provided by the output port of the third gain stage;

a first feedback loop provided from the output port of the third gain stage to the output port of the second gain stage;

a second feedback loop provided from the output port of the third gain stage to the output port of the first gain stage;

a first feed forward transconductance stage extending from the input port of the first gain stage to the output port of the third gain stage, wherein the first feed forward transconductance stage is for canceling one of the zeros introduced by the first and second feedback loop in the transfer function of the three stage amplifier;

a second feed forward transconductance stage extending from the output port of the first gain stage to the output port of the third gain stage, wherein the second feed forward transconductance stage is for canceling another one of the zeros introduced by the first and second feedback loop in the transfer function; and, a third feed forward transconductance stage extending from the input port of the first gain stage to the output port of the second gain stage, wherein the third feed forward transconductance stage is for canceling one of two non-dominant poles in the transfer function resulting in a transfer function of the three stage amplifier having only two poles.

According to the invention there is provided a compensated three stage amplifier comprising:
  a NMC and NGCC compensated cascaded three stage amplifier for receiving an input signal and for providing an amplified output signal in dependence thereupon; and,
  further compensation means, wherein the further compensation means is designed such that it cancels one of two non-dominant poles in the transfer function of the NMC and NGCC compensated cascaded three stage amplifier for providing a transfer function having only two poles.

According to the invention there is also provided a compensated three stage amplifier comprising:
  a NMC and NGCC compensated cascaded three stage amplifier for receiving an input signal and for providing an amplified output signal in dependence thereupon; and,
  a non-inverting gain stage, wherein the non-inverting gain stage is for canceling one of two non-dominant poles in the transfer function of the NMC and NGCC compensated cascaded three stage amplifier for providing a transfer function having only two poles.

According to the invention there is further provided a method for compensating a cascaded three stage amplifier comprising the steps of:
  providing a NMC and NGCC compensated cascaded three stage amplifier for receiving an input signal and for providing an amplified output signal in dependence thereupon;
  providing further compensation means; and,
  using the further compensation means for cancelling a non-dominant pole in the transfer function of the NMC and NGCC compensated cascaded three stage amplifier in order to provide a transfer function having only two poles.

BRIEF DESCRIPTION OF THE DRAWINGS

Exemplary embodiments of the invention will now be described in conjunction with the following drawings, in which.

DETAILED DESCRIPTION OF THE INVENTION

Amplifiers having high gain and high speed are essential components in modern analog circuits and are, therefore, widely used in a wide range of applications. There is a growing emphasis on designing these amplifiers using low voltage processes in order to reduce power consumption. Furthermore, these amplifiers are employed in devices having smaller dimensions, higher speed and a scaled down supply voltage. This causes problems in the amplifier design. To achieve higher gain cascading—gain enhancement techniques—are replaced using cascading of a plurality of amplifier stages. However, cascading of amplifier stages causes severe stability problems.

Figure 1:
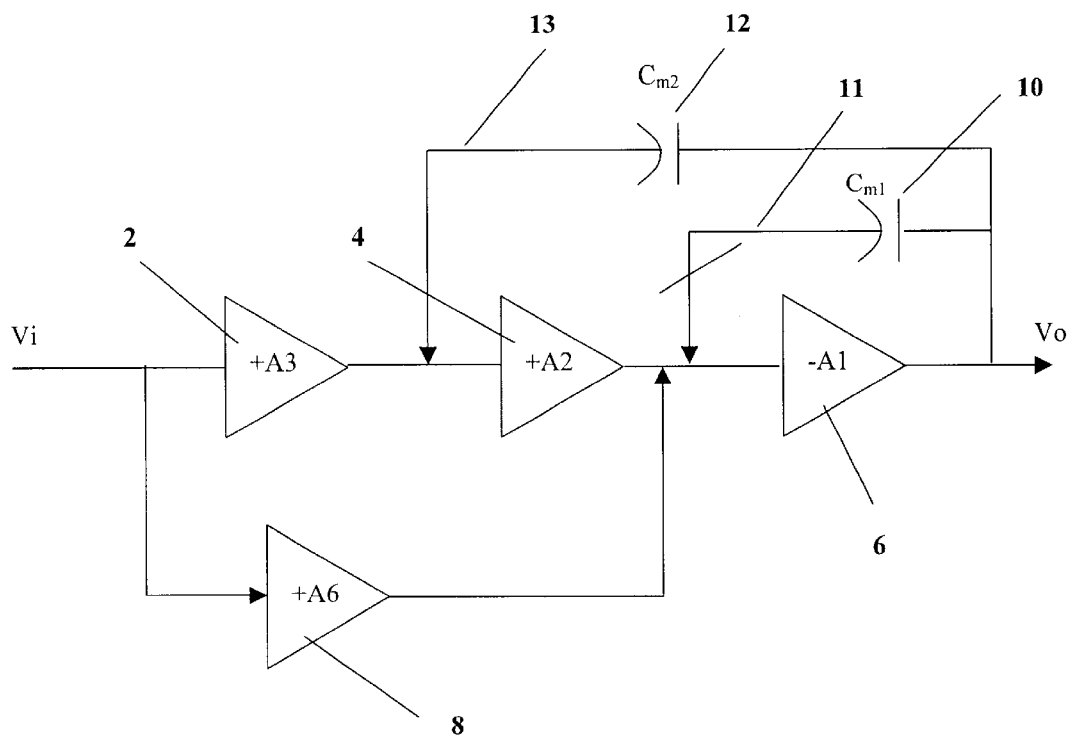
FIG. 1 is a simplified block diagram schematically illustrating MNMC compensated three stage amplifier according to the prior art—each symbol A indicating a Gm stage.
Figure 2:
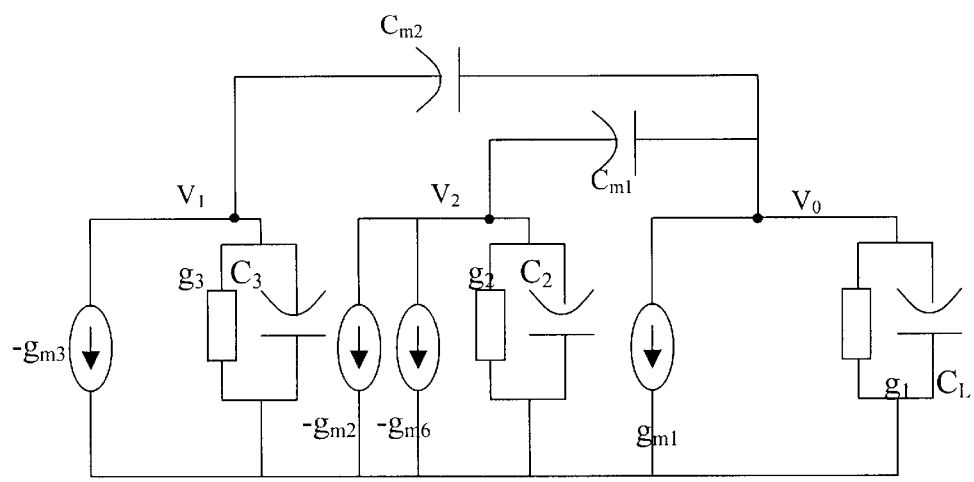
FIG. 2 is a circuit diagram for small signal analysis of the MNMC compensated three stage amplifier shown in FIG. 1.

Hence frequency compensation techniques are widely used to solve stability problems in multistage amplifiers. One commonly used prior art frequency compensation technique is the Multi path Nested Miller Compensation (MNMC) technique. FIG. 1 shows a block diagram of a three stage MNMC compensated amplifier. Here, an extra input stage 8 is added to the Nested Miller Compensation (NMC) circuit. The extra input stage 8 introduces a zero in the left hand side of the complex S-domain of the transfer function of the amplifier. The extra input stage is designed such that the introduced zero is placed on top of a non dominant pole of the transfer function to cancel its effect. However, Miller capacitors 10 and 12 in the feedback paths 11 and 13 introduce zeros in the right hand side of the complex S-domain of the transfer function. The MNMC compensation technique assumes that the zeros introduced by the Miller capacitors in the S-domain are located at high frequencies and, hence, do not affect the stability of the amplifier at operating frequencies. However, when designing a high speed amplifier for modern analog circuits these zeros result in severe stability problems at the higher operating frequencies of the modem analog circuits. The zero introduced by the Miller capacitor 10 depends on the transconductance of final stage amplifier 6. As the transconductance of the final stage amplifier 6 changes due to changes in the load the zeros move in frequency in the S-domain. This results in a dependence of the stability upon the load of the final stage amplifier 6. Referring to FIG. 2 a circuit diagram of the MNMC compensated amplifier illustrated in FIG. 1 for small signal analysis is shown. Based on the circuit diagram shown in FIG. 2 the nodal equations for the transfer function of the MNMC compensated amplifier are as follows:

$$(V_0-V_1)SC_{m2}+g_{m3}V_i-V_1(g_3+SC_1)=0 \tag{1}$$

$$(V_0-V_2)SC_{m1}+g_{m2}V_1+g_{m6}V_i-V_2(g_2+SC_2)=0 \tag{2}$$

$$(V_0-V_2)SC_{m1}+(V_0-V_1)SC_{m2}+g_{m1}V_2+V_0(g_1+SC_1)=0 \tag{3}$$

Rewritten in matrix form equations (1) to (3) result in equation (4):

$$\begin{bmatrix} SC_{m2} & -(g_3+SC_{m2}) & 0 \\ SC_{m1} & g_{m2} & -(g_2+SC_{m1}) \\ g_1+S(C_{m1}+C_{m2}+C_1) & -SC_{m2} & (g_{m1}-SC_{m1}) \end{bmatrix} \cdot \begin{bmatrix} V_0 \\ V_1 \\ V_2 \end{bmatrix} = \begin{bmatrix} -g_{m3}V_i \\ -g_{m6}V_i \\ 0 \end{bmatrix} \tag{4}$$

Based on the following assumptions:

$g_{1,2,3}$'s $\ll g_{m1,2,3}$'s $C2, C3 \ll C_{m1}, C_{m2}, C_L$ $C_1 = C_L$ + parasitic capacitance at that node.

The above matrix is solved using Cramer's rule resulting in equation (5) for the transfer function:

$$\frac{Vo}{Vi} = \frac{\begin{array}{c}-g_{m1}g_{m2}g_{m3} - S[g_{m6}g_{m1}C_{m2} - g_{m3}g_{m2}C_{m1}] - \\ S^2[-g_{m6} - g_{m3}]C_{m2}C_{m1}\end{array}}{g_1g_2g_3 + S[g_{m1}g_{m2}C_{m2}] + S^2[g_{m1} - g_{m2}]C_{m1}C_{m2} + S^3C_{m1}C_{m2}C_1} \quad (5)$$

Solving the quadratic equation in the numerator of equation (5) for S results in a location of two zeros in the complex S-domain introduced by the Miller capacitors. The zeros act like a pole in the denominator causing the amplifier to reach instability—open loop gain=1 and phase=180°—within the operating frequency. Therefore, these zeros need to be compensated.

Figure 3:
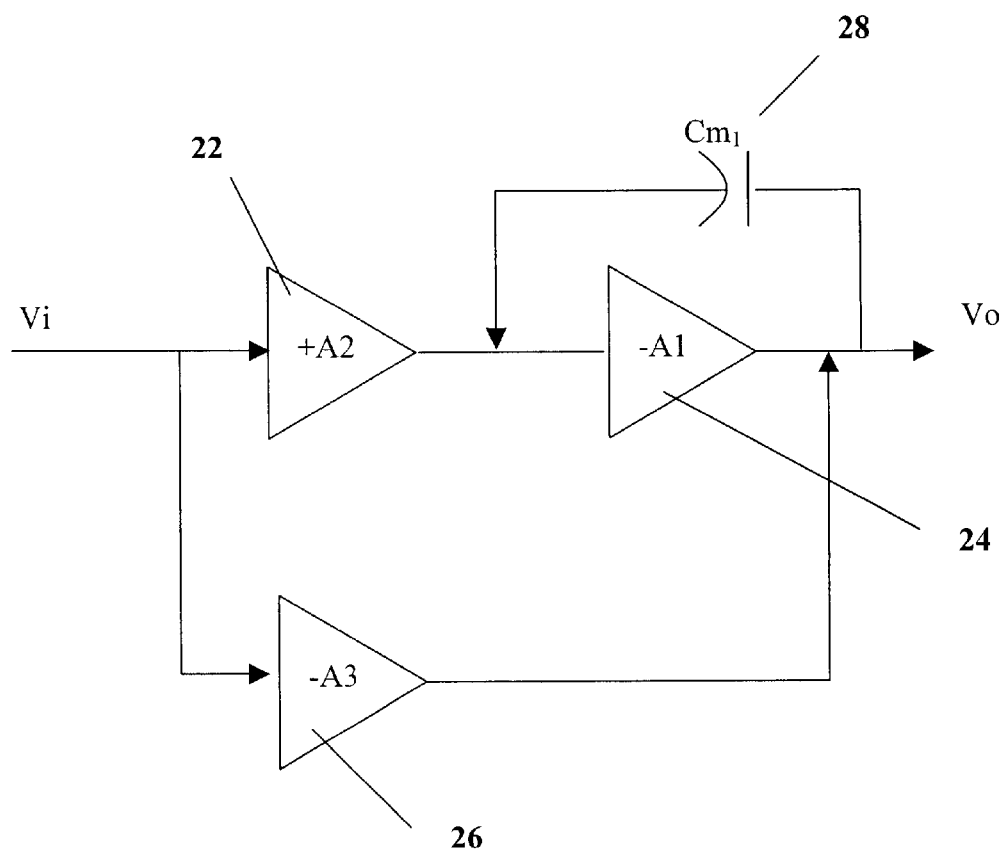
FIG. 3 is a simplified block diagram schematically illustrating a Gm-C compensated two stage amplifier according to the prior art—each symbol A indicating a Gm stage.

To overcome the stability problem caused by the Miller capacitors feed forward gain stages have been introduced that drive the Miller capacitors in order to compensate for the zeros introduced by the Miller capacitors. FIG. 3 illustrates this concept for a two stage amplifier comprising stages 22 and 24. The zero introduced by Miller capacitor 28 is compensated by the feed forward gain stage 26. Applying this concept to a three stage amplifier the resulting Nested Gm-C Compensation (NGCC) circuit removes the zeros introduced by the Miller capacitors. Therefore, the resulting transfer function of the NGCC compensated amplifier has just 3 poles. On the assumption one of the three poles being dominant and the other two being non-dominant, stable operation of the amplifier is obtained by spreading the dominant and the non-dominant poles wide apart in the S-domain. However, balancing a three pole system is substantially more difficult compared to a two pole system comprising a dominant pole and a single non-dominant pole. It is, therefore, not straightforward to design cascaded amplifiers with high gain as well as wide bandwidth.

This is a serious drawback for the application of cascaded amplifiers in modern analog circuits. In order to meet the requirements for these circuits normally three amplifier stages have to be cascaded, resulting in the stability problems outlined above.

In order to overcome these drawbacks of the prior art the compensation technique according to the invention introduces means to cancel the zeros introduced by the Miller capacitors as well as one of the non-dominant poles in the transfer function of a three stage amplifier in the form of feedback circuit elements and feed forward transconductace stages. The final transfer function of such a compensated cascaded three stage amplifier has then only two poles. Such a two pole system is much more desirable for designing a stable cascaded amplifier having high gain as well as a wide operating bandwidth, because it substantially facilitates the design of a stable operating three stage amplifier, as outlined below.

As will be apparent to those of skill in the art the compensation technique according to the invention is not limited to three stage amplifiers but to any number of cascaded amplifiers allowing cancellation of the zeros and a reduction of the number poles in the amplifiers transfer function. However, application of this technique to amplifiers having more than three cascaded amplifiers will result in a system having more than two poles. For simplicity, the following description of the compensation technique according to the invention is limited to the preferred embodiment of a three stage amplifier.

Figure 4:
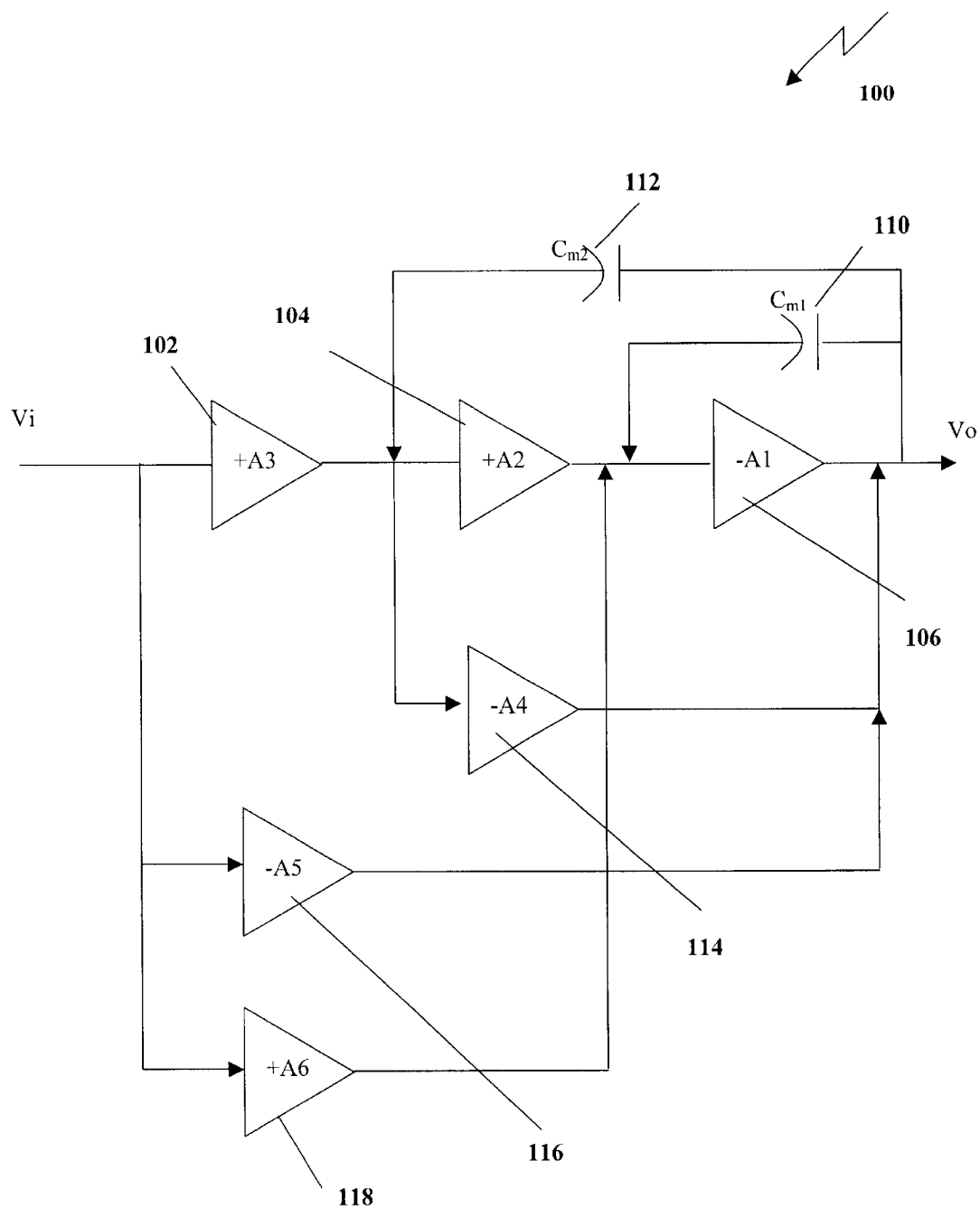
FIG. 4 is a simplified block diagram schematically illustrating a MNGCC compensated three stage amplifier according to the present invention—each symbol A indicating a Gm stage; and, FIG. 5 is a circuit diagram for small signal analysis of the MNGCC compensated three stage amplifier according to the present invention shown in FIG. 4.

Referring to FIG. 4 a Multipath Nested Gm-C Compensation (MNGCC) circuit according to the invention is shown. The MNGCC compensated three stage amplifier 100 according to the invention comprises three amplifier stages 102, 104, and 106, Miller capacitors 110 and 112 providing feedback loops and feed forward transconductance stages 114 and 116. This topology comprising the three amplifier stages, the Miller capacitors and the feed forward gain stages is comparable to a combination of nested Miller compensation and NGCC. In order to cancel one of the non-dominant poles in the three stage amplifier a parallel path to the input signal through a feed forward transconductance stage 118 is introduced. This additional feed forward transconductance stage 118 has same poles as the signal gain stages 102 and 104 and adds a zero to the transfer function of the amplifier 100. The feed forward transconductance stage 118 is designed such that the additional zero cancels one of the non-dominant poles in the transfer function, yielding a final transfer function with just two poles, which will be shown in the following.

Figure 5:
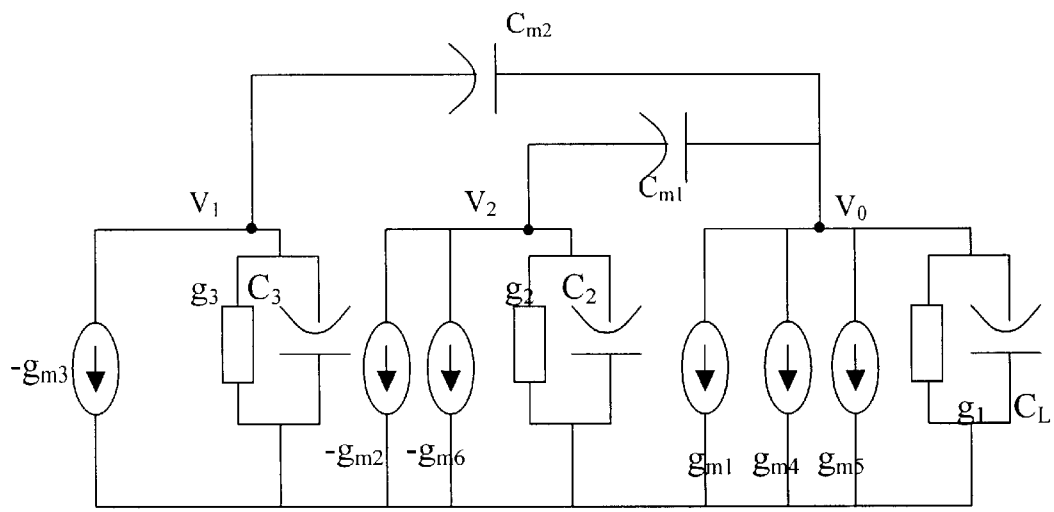

Referring to FIG. 5 a circuit diagram of the MNGCC compensated amplifier 100 according to the invention illustrated in FIG. 4 for small signal analysis is shown. Based on the circuit diagram shown in FIG. 5, the nodal equations for the transfer function of the MNGCC compensated amplifier are as follows:

$$(V_0-V_1)SC_{m2}+g_{m3}V_i-V_1(g_3+SC_1)=0 \quad (6)$$

$$(V_0-V_2)SC_{m1}+g_{m2}V_1+g_{m6}V_i-V_2(g_2+SC_2)=0 \quad (7)$$

$$(V_0-V_2)SC_{m1}+(V_0-V_1)SC_{m2}+g_{m1}V_2+g_{m5}V_i+g_{m4}V_1+V_0(g_1+SC_1)=0 \quad (8)$$

Rewritten in matrix form equations (6) to (8) result in equation (9):

$$\begin{bmatrix} SC_{m2} & -(g_3+SC_{m2}) & 0 \\ SC_{m1} & g_{m2} & -(g_2+SC_{m1}) \\ g_1+S(C_{m1}+C_{m2}+C_1) & g_{m4}-SC_{m2} & (g_{m1}-SC_{m1}) \end{bmatrix} \cdot \begin{bmatrix} V_0 \\ V_1 \\ V_2 \end{bmatrix} = \begin{bmatrix} -g_{m3}V_i \\ -g_{m6}V_i \\ -g_{m5}V_i \end{bmatrix} \rightarrow (9)$$

Based on the following assumptions:

$g_{1,2,3}$'s<<$g_{m1,2,3}$'s

C2, C3<<$C_{m1}$, $C_{m2}$, $C_L$ $C_1=C_L$+parasitic capacitance at that node.

The above matrix is solved using Cramer's rule resulting in equation (10) for the transfer function:

$$\frac{Vo}{Vi} = \frac{\begin{array}{c}-g_{m1}g_{m2}g_{m3} - S[g_{m4}g_{m3}C_{m1} + g_{m6}g_{m1}C_{m2} - g_{m3}g_{m2}C_{m1}] - \\ S^2[g_{m5} - g_{m6} - g_{m3}]C_{m2}C_{m1}\end{array}}{\begin{array}{c}g_1g_2g_3 + S[g_{m1}g_{m2}C_{m2}] + \\ S^2[g_{m4}+g_{m1}-g_{m2}]C_{m1}C_{m2} + S^3C_{m1}C_{m2}C_1\end{array}} \quad (10)$$

Assuming:

$g_{m5}=g_{m3}+g_{m6}$;

$g_{m4}=g_{m2}$;

Equation (10) is rewritten as follows:

$$\frac{Vo}{Vi} = \frac{-g_{m1}g_{m2}g_{m3} - Sg_{m6}g_{m1}C_{m2}}{g_1g_2g_3 + Sg_{m1}g_{m2}C_{m2} + S^2g_{m1}C_{m1}C_{m2} + S^3C_{m1}C_{m2}C_1} \quad (11)$$

Taking gm1gm2gm3 common in numerator of equation (11) and g1g2g3 common in the denominator of equation (11) by results in equation 12 as follows:

$$\frac{Vo}{Vi} = \frac{-\frac{gm1gm2gm3}{g1g2g3}\left(1 + \frac{Sgm6Cm2}{gm2gm3}\right)}{1 + S\frac{gm1gm2gm3Cm2}{g_1g_2g_3g_{m3}} + S^2\frac{gm1gm2gm3Cm2}{g_1g_2g_3g_{m3}}\frac{C_{m1}}{g_{m2}} + S^3\frac{gm1gm2gm3Cm2}{g_1g_2g_3g_{m3}}\frac{C_{m1}C_L}{g_{m2}g_{m1}}}$$

Substituting:
$C_{m2}/g_{m3}=k_2$;
$C_{m1}/g_{m2}=k_1$;
$C_L/g_{m1}=p'_1$;
A=(gm1gm2gm3)/(g1g2g3);
Zd=(gm2gm3)/(gm6Cm2)
In equation (12) and simplifying, we get $$\frac{V_o}{V_i} = \frac{A\left(1 + \frac{S}{Z_d}\right)}{(1 + S \cdot k_1 + S^2 \cdot k_1 \cdot p'_1)(1 + S \cdot A \cdot k_2)} \quad (13)$$

Solving the quadratic equation:

$$1 + S \cdot k_1 + S^2 \cdot k_1 \cdot p'_1 = 0;$$

$$S_{1,2} = \frac{-k_1 \pm \sqrt{k_1^2 - 4 \cdot p'_1 \cdot k_1}}{k_1 \cdot p'_1};$$

for S in equation (13) allows the determination of the two poles introduced by the feed forward gain 118 of the transfer function of the MNGCC compensated amplifier according to the invention:

$$S1 = \frac{-1}{2 \cdot p'_1} \cdot \left[1 + \sqrt{1 - \frac{4 \cdot p'_1}{k_1}}\right]; \quad (14)$$

$$S2 = \frac{-1}{2 \cdot p'_1} \cdot \left[1 - \sqrt{1 - \frac{4 \cdot p'_1}{k_1}}\right]$$

Using the MNGCC compensation according to the invention introduces a pole S1 being located at a higher frequency while pole S2 is located at a lower frequency in the complex S-domain as shown in equation (14). In order to obtain a two pole system for the MNGCC compensated amplifier pole S2 is placed on zero Zd, so they cancel out each other.

This results in a transfer function for the three stage amplifier having only two poles—p1' and S1. Optimizing such a two pole system for high gain and high bandwidth is substantially less difficult than a three pole system or a system having two poles and zeros.

In order to optimize the MNGCC compensated amplifier for high bandwidth the compensation is designed such that pole S1 is located at a high frequency in the complex S-domain, preferably as high as possible. However, maximizing S1 in frequency with respect to pole p1' located at a low frequency in the complex S-domain results in the condition of k1 being infinite, which implies the transconductance gm2 being zero, i.e. the MNGCC compensated amplifier is a two stage system. Hence, gain is sacrificed for bandwidth. In order to optimize the MNGCC amplifier for high gain as well as high bandwidth the compensation is designed such that p1' is approximately 10% of k1. Using these design parameters results in:

$$S_1 \approx \frac{-1}{2 \cdot p'_1} \quad \& \quad \frac{g_{m6}}{C_{m1}} = \frac{g_{m3}}{C_{m2}}.$$

As is evident, choosing p1' being approximately 10% of k1 has been found by the inventor as a preferred design parameter for specific applications but is not limited thereto. A person of skill in the art will be able to determine this parameter according to his or her specific needs.

Summarizing the characteristics of the MNGCC compensation circuit according to the invention from the above equations reads as follows:

$$\text{Dominant pole} = -\frac{gm1gm2gm3Cm2}{g_1g_2g_3g_{m3}}$$

$$\text{Non-dominant pole} = -\frac{g_{m1}}{2C_L}$$

$$\text{Unity Gain bandwidth } (\omega_t) = \frac{g_{m3}}{C_{m2}}$$

$$\text{Settling time} = \frac{-\ln a}{\omega_t}$$

The approximate cancellation of a zero and a pole gives rise to a pole zero doublet, which causes the settling time to be different from that of ordinary $2^{nd}$ order systems.

Normalizing the characteristic equations (5) and (11) for MNMC and MNGCC compensated amplifiers, respectively, with respect to gain bandwidth GB allows comparisons of power consumption and bandwidth of the two compensation techniques. The normalized equations (15) and (16) for MNMC and MNGCC compensated amplifiers, respectively, read as follows:

$$1 + \frac{Sn(GB')gm1'gm2'Cm2}{g1g2g3} + \quad (15)$$

$$\frac{Sn^2(GB')^2(gm1'-gm2')Cm2Cm1}{g1g2g3} + \frac{Sn^3(GB')^3Cm2Cm1C1}{g1g2g3}$$

$$1 + \frac{Sn(GB)gm1gm2Cm2}{g1g2g3} + \quad (16)$$

$$\frac{Sn^2(GB)^2gm1Cm2Cm1}{g1g2g3} + \frac{Sn^3(GB)^3Cm2Cm1C1}{g1g2g3}$$

Assuming a same gain bandwidth GB=GB' for both compensation techniques and in equations (15) and (16):
gm1=(gm1'-gm2');
gm1<gm1'
Result in I1<I1', i.e. for a same gain bandwidth using the MNGCC compensation technique according to the invention the dissipated power—loss—is substantially smaller.

Therefore, the MNGCC compensation circuit according to the invention is highly advantageous for implementation in modern analog circuits by providing a higher bandwidth for multistage amplifiers as well as reducing the dissipated power which is becoming more and more a concern if the devices are smaller. This reduces considerably the supply power and, furthermore, reduces design constrains for providing cooling of smaller devices due to the dissipated power.

These characteristics make the MNGCC compensated amplifier highly desirable in many modem applications such as small signal amplifiers as used, for example, in cell phones, and in wireless LANs. Other applications of the MNGCC compensated amplifier include use as a terminated cable driver or as a central office driver in X-DSL applications.

Numerous other embodiments may be envisaged without departing from the spirit or scope of the invention.

What is claimed is:

1. A compensated three stage amplifier comprising:
a first, a second and a third cascaded gain stage for amplifying an input signal and providing an output signal in dependence thereupon, each gain stage comprising an input port and an output port, wherein the input signal is received at the input port of the first gain stage and wherein the output signal is provided by the output port of the third gain stage;
a first feedback loop provided from the output port of the third gain stage to the output port of the second gain stage;
a second feedback loop provided from the output port of the third gain stage to the output port of the first gain stage;
a first feed forward transconductance stage extending from the input port of the first gain stage to the output port of the third gain stage, wherein the first feed forward transconductance stage is for canceling one of the zeros introduced by the first and second feedback loop in the transfer function of the three stage amplifier;
a second feed forward transconductance stage extending from the output port of the first gain stage to the output port of the third gain stage, wherein the second feed forward transconductance stage is for canceling another one of the zeros introduced by the first and second feedback loop in the transfer function; and,
a third feed forward transconductance stage extending from the input port of the first gain stage to the output port of the second gain stage, wherein the third feed forward transconductance stage is for canceling one of two non-dominant poles in the transfer function resulting in a transfer function of the three stage amplifier having only two poles.

2. A compensated three stage amplifier as defined in claim 1, wherein the first and second gain stage comprises a non-inverting gain stage, and wherein the third gain stage comprises an inverting gain stage.

3. A compensated three stage amplifier as defined in claim 2, wherein each of the first and the second feed forward transconductance stages comprises an inverting gain stage.

4. A compensated three stage amplifier as defined in claim 3, wherein the third feed forward transconductance stage comprises a non-inverting gain stage.

5. A compensated three stage amplifier comprising:
a NMC and NGCC compensated cascaded three stage amplifier for receiving an input signal and for providing an amplified output signal in dependence thereupon; and,
further compensation means, wherein the further compensation means is for canceling one of two non-dominant poles in the transfer function of the NMC and NGCC compensated cascaded three stage amplifier for providing a transfer function having only two poles.

6. A compensated three stage amplifier comprising:
a NMC and NGCC compensated cascaded three stage amplifier for receiving an input signal and for providing an amplified output signal in dependence thereupon; and,
a non-inverting gain stage, wherein the non-inverting gain stage is for canceling one of two non-dominant poles in the transfer function of the NMC and NGCC compensated cascaded three stage amplifier for providing a transfer function having only two poles.

7. A method for compensating a cascaded three stage amplifier comprising the steps of:
providing a NMC and NGCC compensated cascaded three stage amplifier for receiving an input signal and for providing an amplified output signal in dependence thereupon;
providing further compensation means; and,
using the further compensation means for cancelling a non-dominant pole in the transfer function of the NMC and NGCC compensated cascaded three stage amplifier in order to provide a transfer function having only two poles.

8. A method for compensating a cascaded three stage amplifier comprising the steps of:
providing a NMC and NGCC compensated cascaded three stage amplifier for receiving an input signal and for providing an amplified output signal in dependence thereupon;
providing a feed forward transconductance stage extending from an input port of a first signal gain stage to an output port of a second signal gain stage; and,
using the feed forward transconductance stage for cancelling a non-dominant pole in the transfer function of the NMC and NGCC compensated cascaded three stage amplifier in order to provide a transfer function having only two poles.

9. A method for compensating a cascaded three stage amplifier as defined in claim 8, wherein the feed forward transconductance stage comprises a non-inverting gain stage.

10. A method for compensating a cascaded three stage amplifier as defined in claim 9, wherein the feed forward transconductance stage has same poles as the signal path comprising first and second gain stage.

11. A method for compensating a cascaded three stage amplifier as defined in claim 10, wherein a zero introduced by the feed forward transconductance stage cancels one of the non-dominant poles in the transfer function of the NMC and NGCC compensated cascaded three stage amplifier.

12. A method for compensating a cascaded three stage amplifier as defined in claim 11, wherein a zero introduced by the feed forward transconductance stage cancels one of the non-dominant poles in the transfer function of the NMC and NGCC compensated cascaded three stage amplifier providing a two pole system for the transfer function having one dominant pole and one non-dominant pole.

13. A method for compensating a cascaded three stage amplifier as defined in claim 12, wherein the remaining non-dominant pole is located at a substantially high frequency in the complex S-domain of the transfer function.

14. A method for compensating a cascaded three stage amplifier as defined in claim 13, wherein the dominant pole is determined as being 10% of the ratio of the transconductance of a feedback loop extending from an output port of the third signal gain stage to an input port of the third signal gain stage to the transconductance of the second signal gain stage.

* * * * *